United States Patent
Brucker et al.

(10) Patent No.: US 7,141,145 B2
(45) Date of Patent: Nov. 28, 2006

(54) GAS INJECTION FOR UNIFORM COMPOSITION REACTIVELY SPUTTER-DEPOSITED THIN FILMS

(75) Inventors: Charles Frederick Brucker, Pleasanton, CA (US); Paul S. McLeod, Berkeley, CA (US); Chang Yi, Fremont, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 264 days.

(21) Appl. No.: 10/676,105

(22) Filed: Oct. 2, 2003

(65) Prior Publication Data
US 2005/0072664 A1 Apr. 7, 2005

(51) Int. Cl.
C23C 14/34 (2006.01)

(52) U.S. Cl. .............. 204/192.2; 204/298.07; 204/298.18; 204/298.26

(58) Field of Classification Search ........... 204/298.07, 204/298.18, 298.26, 192.2
See application file for complete search history.

(56) References Cited

U.S. PATENT DOCUMENTS

| 3,540,993 A | 11/1970 | Wurm et al. | |
| 3,976,555 A * | 8/1976 | Von Hartel | 204/192.14 |
| 4,270,999 A * | 6/1981 | Hassan et al. | 204/192.32 |
| 5,228,968 A * | 7/1993 | Zejda | 204/298.07 |
| 5,556,520 A | 9/1996 | Latz | |
| 5,620,523 A | 4/1997 | Maeda et al. | |
| 5,728,260 A | 3/1998 | Brown et al. | |
| 5,789,322 A | 8/1998 | Brown et al. | |
| 6,627,253 B1 * | 9/2003 | Suzuki et al. | 427/129 |

FOREIGN PATENT DOCUMENTS

JP 05-311425 * 11/1993

OTHER PUBLICATIONS

Machine Translation of JP 05-311425.*

* cited by examiner

Primary Examiner—Rodney G. McDonald
(74) Attorney, Agent, or Firm—McDermott Will & Emery LLP (57) ABSTRACT

A method of forming a thin film on a substrate/workpiece by sputtering, comprising steps of:
  (a) providing an apparatus comprising a vacuum chamber including at least one sputtering source and a gas supply means for injecting a gas containing at least one reactive component into said chamber, the gas supply means comprising a plurality of differently-sized outlet orifices adapted for providing substantially the same flow rate of gas from each orifice;
  (b) providing a substrate/workpiece having at least one surface for formation of a thin film thereon;
  (c) generating a sputtered particle flux from the at least one sputtering source;
  (d) injecting the gas containing the at least one reactive component into the chamber via the gas supply means, such that the same gas flow rate is provided at each orifice; and
  (e) forming a reactively sputtered thin film on the at least one surface of the substrate/workpiece, the reactively sputtered thin film having a substantially uniform content of the at least one reactive component.

15 Claims, 7 Drawing Sheets

Injection geometry: Pressurized linear tube with (8) equal diameter orifices

FIG. 3(B)

End-to-End Variation in Flow Rate vs. Hole Size (for 8 evenly spaced holes on 32 cm x 0.375" dia. Tube)

FIG. 3(C)

End-to-End Variation in Flow Rate vs. Tube Dia. (for 8 evenly spaced 0.008" holes on 32 cm long Tube)

FIG. 4(A)

Double Ring Injector

Wishbone Injector

FIG. 5(B)

Wishbone Injection, 0.008" Orifice Diameter

Angular Position at 1.2" radius (degrees)

FIG. 6(A)

Injection geometry: Pressurized linear tube with (8) gradient diameter orifices

GAS INJECTION FOR UNIFORM COMPOSITION REACTIVELY SPUTTER-DEPOSITED THIN FILMS

FIELD OF THE INVENTION

The present invention relates to a method and apparatus for injection of a gas into a sputtering apparatus chamber for obtaining highly uniform composition reactive sputter deposition of a thin film over substantially the entirety of a substrate surface. The invention has particular utility in the manufacture of disk-shaped magnetic and magneto-optical data/information storage and retrieval media.

BACKGROUND OF THE INVENTION

Magnetic and MO recording media are widely employed in various applications, particularly in the computer industry for data/information storage and retrieval purposes. A magnetic medium in, e.g., disk form, such as utilized in computer-related applications, comprises a non-magnetic substrate, for example, of glass, ceramic, glass-ceramic composite, polymer, metal or metal alloy, typically an aluminum (Al)-based alloy such as aluminum-magnesium (Al—Mg), having at least one major surface on which a layer stack comprising a plurality of thin film layers constituting the medium are sequentially deposited. In the case of longitudinal type magnetic recording media, such layers may include, in sequence from the substrate deposition surface, a plating layer, e.g., of amorphous nickel-phosphorus (Ni—P), a polycrystalline underlayer, typically of chromium (Cr) or a Cr-based alloy such as chromium-vanadium (Cr—V), a longitudinally oriented magnetic layer, e.g., of a cobalt (Co)-based alloy, and a protective overcoat layer, typically of a carbon (C)-based material, such as diamond-like carbon (DLC), having good mechanical (i.e., tribological) and corrosion resistance properties. Perpendicular type magnetic recording media typically comprise, in sequence from the surface of a non-magnetic substrate, an underlayer of a magnetically soft material, at least one non-magnetic interlayer or intermediate layer, a vertically (i.e., perpendicularly) oriented recording layer of a magnetically hard material, and a protective overcoat layer.

A similar situation exists with magneto-optical (MO) media, wherein a layer stack is formed which comprises a reflective layer, typically of a metal or metal alloy, one or more rare-earth thermo-magnetic (RE-TM) alloy layers, one or more dielectric layers, and a protective overcoat layer, for functioning as reflective, transparent, writing, writing assist, and read-out layers, etc.

According to conventional manufacturing technology, a majority (if not all) of the above-described layers constituting multi-layer longitudinal and perpendicular magnetic media, as well as MO recording media, are deposited by means of cathode sputtering processing. For example, the magnetic recording layers are typically fabricated by sputter depositing a Co-based alloy film, wherein the alloying elements are selected to promote desired magnetic and microstructural properties. In the case of longitudinal-type magnetic disk recording media, metallic and metalloidal elements, such as, for example, Cr, Pt, Ta, B, and combinations thereof, have been found to be effective. Similar alloying elements have been found to be useful in the case of perpendicular-type magnetic disk recording media, and in addition, reactive sputter deposition of the Co-based alloys in an oxygen ($O_2$)-containing atmosphere has been found to be especially effective in controlling (i.e., limiting) exchange coupling between adjacent magnetic grains.

In a typical reactive sputtering process utilized for formation of perpendicular-type magnetic recording media, $O_2$ gas is mixed with an inert sputtering gas, e.g., Ar, and is consumed by the depositing Co-based alloy magnetic film. Due to the high reactivity of $O_2$ with metals, and since only partial oxidation of the depositing Co-based alloy magnetic film is desired, the degree of oxidation as a function of the location or position on the substrate (i.e., disk) surface tends to exhibit wide variation depending upon the process conditions, including, inter alia, $O_2$ injection geometry, gas pumping (i.e., evacuation) geometry, gas flow rate, and film deposition rate.

Figure 1:
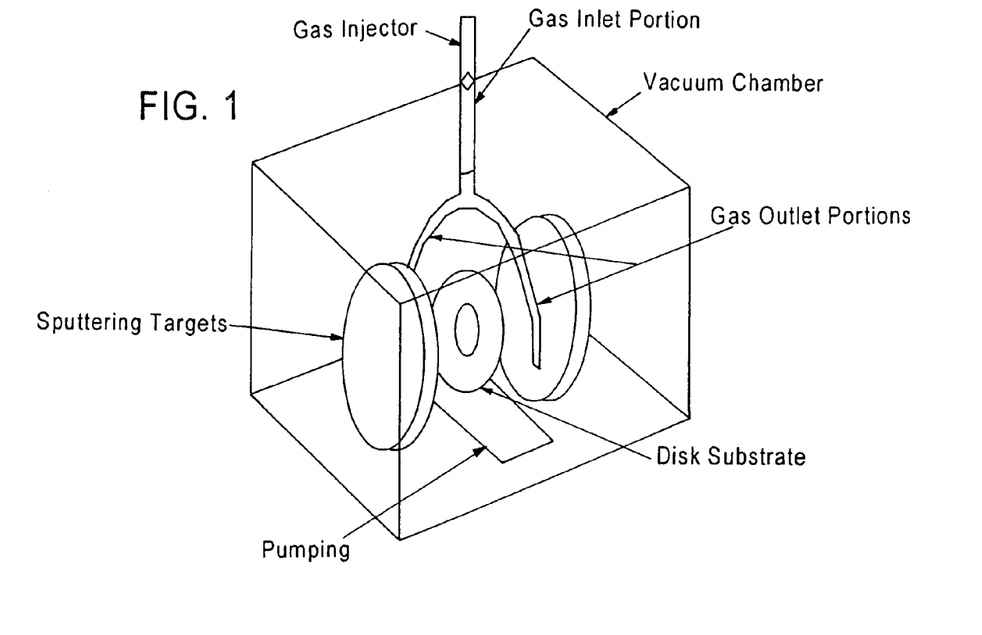
FIG. 1 is a simplified, schematic, perspective view of a portion of a reactive sputtering apparatus conventionally utilized for performing reactive sputtering of magnetic thin films in the manufacture of disk-shaped magnetic recording media.

FIG. 1 is a simplified, schematic, perspective view of a portion of a conventional reactive sputtering apparatus which may be utilized for performing reactive sputtering of magnetic thin films as part of the manufacturing process of disk-shaped magnetic recording media. As illustrated, the apparatus comprises a vacuum chamber equipped with an opening for connection to a pumping means for evacuating the interior of the chamber; at least one, preferably a pair of facing sputtering targets or sources of conventional type, e.g., a pair of magnetron sputtering guns; a means for positioning a substrate/workpiece in the space between the pair of facing sputtering sources, illustratively a disk-shaped substrate for a magnetic recording medium, for receipt of sputtered particle flux therefrom on both substrate surfaces; and a gas injector having a gas inlet portion extending outside the chamber for connection to a source of a gas, and a gas outlet portion within the chamber, for injecting gas, e.g., a reactive gas, in the space between the pair of facing sputtering sources. Illustratively, the gas injector is "wishbone"-shaped, and comprises a linearly elongated, tubular inlet portion having a first, gas inlet end, and a second end, with a pair of arcuately-shaped, tubular gas outlet portions extending from the second end, comprising a plurality of spaced-apart gas outlet orifices.

Figure 2A:
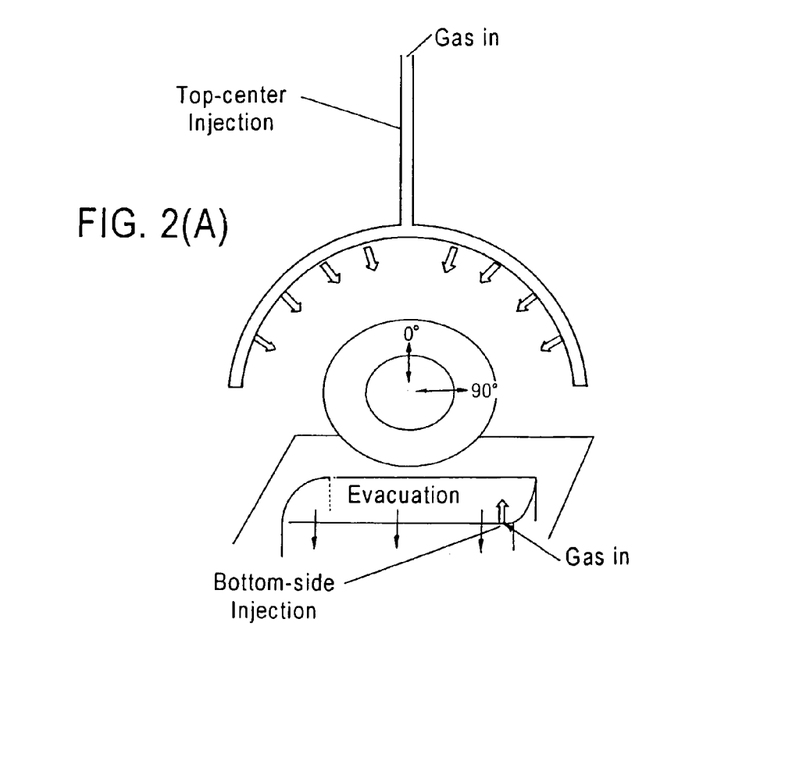
FIG. 2(A) is a simplified, schematic, partially perspective view of a portion of a reactive sputtering apparatus utilized for determining the circumferential variation of S* of magnetic disks fabricated according to conventional means and methodology.
Figure 2B:
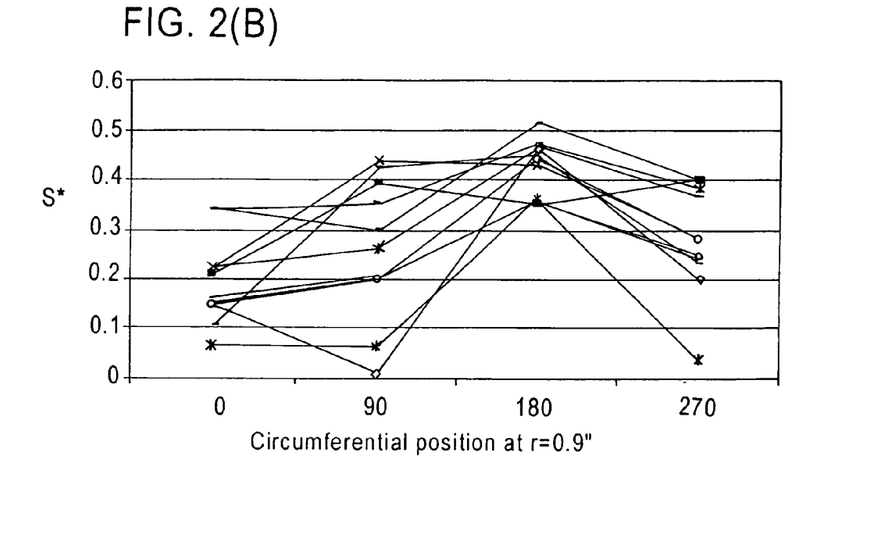
FIG. 2(B) is a graph for illustrating the circumferential variation of S* for magnetic disks fabricated by means of "top-center" $O_2$/Ar injection (relative to a vertically mounted disk substrate) utilizing the "wishbone" style "top-center" gas injector of the sputtering apparatus of FIG. 2(A)
Figure 2C:
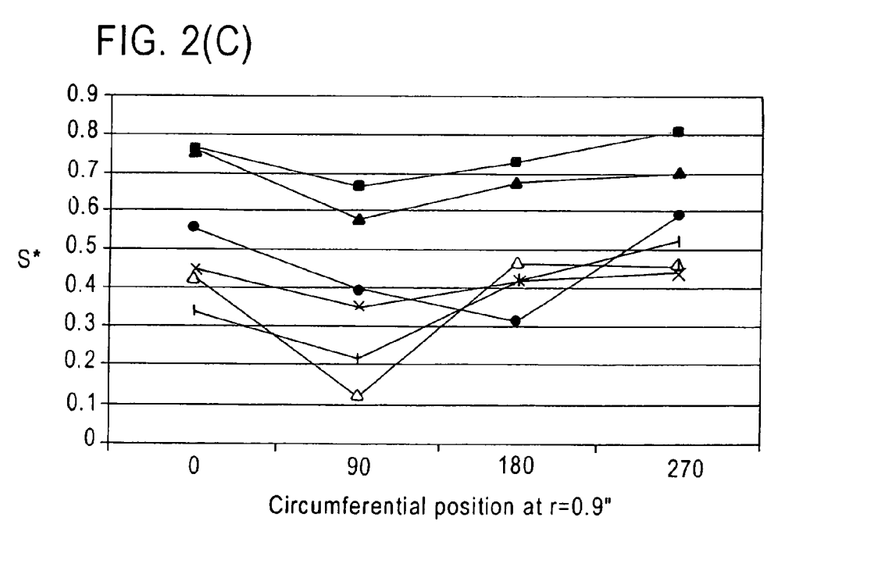
FIG. 2(C) is a graph for illustrating the circumferential variation of S* for magnetic disks fabricated by means of "bottom-side" $O_2$/Ar injection utilizing the sputtering apparatus of FIG. 2(A)

One-disk-at-a-time sputtering apparatus for the hard disk manufacturing industry, e.g., the Intevac MDP-250 (Intevac Co., Santa Clara, Calif.), typically employ gas injection means with design criteria, e.g., geometries, which are poorly suited to the high film uniformity requirements of the hard disk industry, particularly with respect to the special problems presented by reactive sputtering in atmospheres containing $O_2$. For example, FIG. 2(B) is a graph illustrating the circumferential variation of S* for magnetic disks fabricated by means of "top-center" $O_2$/Ar injection (relative to the disk) utilizing the "wishbone" style gas injector of the apparatus of FIG. 2(A), whereas FIG. 2(C) is a graph illustrating the circumferential variation of S* for magnetic disks fabricated by means of "bottom-side" $O_2$/Ar injection utilizing the apparatus of FIG. 2(A), which apparatus comprises at least one conventional sputtering source for forming a film on at least one surface of the vertically positioned, dual-sided, disk-shaped magnetic disk substrate (which at least one conventional sputtering source is not shown in the figure for illustrative simplicity). Herein, the parameter $S^*=1-(dH/dM)_{Hc}(M_r/H_c)$, and is closely related to the slope of the perpendicular M-H hysteresis loop at the coercive field. S* is a sensitive measure of the oxygen content of the oxide content of the perpendicular magnetic recording film. As the oxide content of the magnetic film increases, the exchange coupling between adjacent magnetic grains decreases, the hysteresis slope decreases, and S* decreases.

Specifically, it is seen from FIG. 2(B) that in the case of "top-center" $O_2$/Ar injection, that S* is highest at the bottom of the disk (i.e., at 180°), indicating that the bottom of the disk is oxide-poor, relative to the disk top and sides (i.e., 0, 90, and 270°). By contrast, it is seen from FIG. 2(C) that in the case of "bottom-side" $O_2/Ar$ injection, that S* is lowest, i.e., the oxide content is highest, at the 90° position, corresponding to the region of the disk directly above the $O_2/Ar$ injection port.

A typical manufacturing specification for S* is in the range 0.30–0.50, with a tolerance of ±0.05, and nearly all of the magnetic films of FIGS. 2(B) and 2(C) are seen to exceed the specified tolerance for oxide content. However, the results of FIGS. 2(B) and 2(C) demonstrate that variation, e.g., asymmetry, of oxide content of the deposited magnetic films, as inferred from the values of the parameter S*, can be correlated with the $O_2/Ar$ injection geometry of the sputtering apparatus. In general, the oxide content is highest in the region of the disk surface which is closest to the point of $O_2/Ar$ injection. For the same sputtering chamber and pumping (evacuation) hardware, disks can be manufactured in which the magnetic recording layer is oxide rich at the top, bottom, or side(s), depending upon the geometry of the $O_2/Ar$ injection system, suggesting that the variation in oxide content of the magnetic recording layer (as reflected in the value of S*) can be reduced by proper design of the injection geometry/system.

In view of the foregoing, there exists a clear need for improved means and methodology for fabricating, by reactive sputtering techniques and at deposition rates consistent with the throughput requirements of automated manufacturing processing, thin films having a specified, typically minimal, compositional variation over the substrate surface, of a film constituent supplied via reactive gas injection to the sputtering atmosphere. More specifically, there exists a need for improved means and methodology for overcoming the above-described drawbacks and disadvantages associated with reactive sputtering processing for the manufacture of hard disk magnetic and MO recording media, notably oxide content variation over the disk surface which exceeds specified manufacturing tolerances.

The present invention addresses and solves the problems, disadvantages, and drawbacks described supra in connection with conventional means and methodology for performing reactive sputtering, e.g., of oxide-containing perpendicular magnetic recording layers, while maintaining full compatibility with all aspects of conventional automated manufacturing technology for hard disk magnetic and MO recording media. Further, the means and methodology afforded by the present invention enjoy diverse utility in the manufacture of all manner of devices and products requiring formation of high compositional uniformity thin films by means of reactive sputtering processing.

DISCLOSURE OF THE INVENTION

An advantage of the present invention is an improved sputtering apparatus.

Another advantage of the present invention is an improved reactive sputtering apparatus.

Still another advantage of the present invention is an improved apparatus for reactive sputtering of magnetic thin films for magnetic recording media.

A further advantage of the present invention is an improved method of forming a thin film by sputtering.

Yet another advantage of the present invention is an improved method of forming a thin film by reactive sputtering.

A still further advantage of the present invention is an improved method of forming magnetic thin films for magnetic recording media by reactive sputtering.

Further advantages of the present invention include improved magnetic recording media comprising reactively sputtered magnetic thin films with improved compositional uniformity.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to an aspect of the present invention, the foregoing and other advantages are obtained in part by a sputter deposition apparatus, comprising:

(a) a chamber defining an interior space adapted to be maintained at a reduced pressure;

(b) at least one sputtering source in the chamber;

(c) mounting means for positioning a substrate/workpiece in the chamber for receipt of a sputtered particle flux from the at least one sputtering source; and (d) a gas supply means for injecting a gas into the chamber, the at least one gas supply means extending into the chamber and comprising a plurality of differently-sized outlet orifices adapted for providing substantially the same flow rate of gas from each orifice.

According to embodiments of the present invention, the gas supply means comprises an inlet portion and an outlet portion including the plurality of differently-sized outlet orifices, the size of the outlet orifices progressively increasing with distance from said inlet portion.

Preferred embodiments of the present invention include those wherein the gas supply means comprises a linearly elongated tube having first and second ends, the inlet portion forming the first end, the outlet portion extending towards the second end, the size of the outlet orifices progressively increasing towards the second end; or the gas supply means is wishbone-shaped and comprises a linearly elongated, tubular inlet portion having first and second ends, a pair of arcuately shaped, tubular outlet portions extending from the second end, the size of the outlet orifices of each of the arcuate outlet portions progressively increasing with distance from the second end of the inlet portion.

In accordance with further preferred embodiments of the invention, the at least one sputtering source comprises a pair of mutually facing sputtering sources, and the mounting means is adapted for positioning a substrate/workpiece having a pair of oppositely facing surfaces within a central space defined by the pair of outlet portions of the wishbone-shaped gas supply means; wherein the plurality of outlet orifices of each of the pair of outlet portions face away from the central space.

Still further preferred embodiments of the present invention include those wherein the gas supply means is ring-shaped and comprises a linearly elongated, tubular inlet portion having first and second ends, and a substantially circularly-shaped outlet portion extending from the second end, the size of the plurality of outlet orifices of the outlet portion progressively increasing with distance from the second end of the inlet portion.

Yet further preferred embodiments of the present invention include those wherein the at least one sputtering source comprises a pair of mutually facing sputtering sources, the apparatus comprises a parallel spaced-apart pair of said ring-shaped gas supply means, and the mounting means is adapted for positioning a substrate/workpiece having a pair of oppositely facing surfaces, and is located within a central space located between the circularly-shaped outlet portions of the pair of ring-shaped gas supply means, and the outlet orifices of each of the pair of circularly-shaped outlet portions face inwardly toward the central space.

According to still further preferred embodiments of the present invention, each of the plurality of outlet orifices is circularly-shaped, and each outlet orifice comprises a plug with a central opening extending therethrough defining the diameter of the orifice.

Another aspect of the present invention is a method of forming a thin film on a substrate/workpiece by sputtering, comprising steps of:

(a) providing an apparatus comprising a vacuum chamber including at least one sputtering source and a gas supply means for injecting a gas containing at least one reactive component into said chamber, the gas supply means comprising a plurality of differently-sized outlet orifices adapted for providing substantially the same flow rate of gas from each orifice;

(b) providing the apparatus with a substrate/workpiece having at least one surface for formation of a thin film thereon;

(c) generating a sputtered particle flux from the at least one sputtering source;

(d) injecting the gas containing the at least one reactive component into the chamber via the gas supply means, such that substantially the same gas flow rate is provided at each orifice; and (e) forming a reactively sputtered thin film on the at least one surface of the substrate/workpiece, the reactively sputtered thin film having a substantially uniform content of the at least one reactive component.

According to embodiments of the present invention, step (a) comprises providing an apparatus wherein the gas supply means comprises an inlet portion and an outlet portion including said plurality of differently-sized outlet orifices, the size of the outlet orifices progressively increasing with distance from the inlet portion.

Preferred embodiments of the present invention include those wherein step (a) comprises providing an apparatus wherein the gas supply means comprises a linearly elongated tube having first and second ends, the inlet portion forming the first end, the outlet portion extending towards the second end, the size of the plurality of outlet orifices progressively increasing towards the second end.

Further preferred embodiments of the invention include those wherein step (a) comprises providing an apparatus wherein the gas supply means is wishbone-shaped and comprises a linearly elongated, tubular inlet portion having first and second ends, a pair of arcuately shaped, tubular outlet portions extending from the second end, the size of the plurality of outlet orifices of each of the arcuate outlet portions progressively increasing with distance from the second end of the inlet portion.

Still other preferred embodiments of the present invention include those wherein step (a) comprises providing an apparatus including a pair of mutually facing sputtering sources, step (b) comprises positioning a substrate/workpiece having a pair of surfaces within a central space in the chamber defined by the pair of outlet portions of the wishbone-shaped gas supply means, each surface of the substrate/workpiece facing a respective one of the pair of sputtering sources; and step (c) comprises generating a sputtered particle flux from each of the pair of sputtering sources.

Yet other preferred embodiments of the present invention include those wherein step (a) comprises providing an apparatus wherein the gas supply means is ring-shaped and comprises a linearly elongated, tubular inlet portion having first and second ends, and a substantially circularly-shaped outlet portion extending from the second end, the size of the outlet orifices of the outlet portion progressively increasing with distance from the second end of the inlet portion.

Additional preferred embodiments of the present invention include those wherein step (a) comprises providing an apparatus including a pair of mutually facing sputtering sources, step (b) comprises positioning a substrate/workpiece having a pair of surfaces within a central space in the chamber defined by a parallel spaced-apart pair of the ring-shaped gas supply means, each surface of the substrate/workpiece facing a respective one of said pair of sputtering sources, and step (c) comprises generating a sputtered particle flux from each of the pair of sputtering sources.

Particularly preferred embodiments of the present invention include those wherein step (a) comprises providing an apparatus including at least one Co-based magnetic alloy, step (b) comprises providing the apparatus with a precursor substrate/workpiece for a magnetic recording medium, step (d) comprises injecting an oxygen-containing gas into the chamber, and step (e) comprises forming a Co-based alloy magnetic recording layer with oxide-separated magnetic grains.

Still another aspect of the present invention is a method of manufacturing a magnetic recording medium, comprising steps of:

(a) providing an apparatus comprising a vacuum chamber including at least one source for supplying a flux of sputtered Co-based alloy particles and a gas supply means for injecting an oxygen-containing gas into the chamber, the gas supply means comprising a plurality of differently-sized outlet orifices adapted for providing substantially the same flow rate of gas from each orifice;

(b) providing the apparatus with a precursor substrate/workpiece for a magnetic recording medium, the precursor substrate/workpiece having at least one surface for formation of a thin film thereon;

(c) generating the sputtered Co-based alloy particle flux from the at least one source;

(d) injecting the oxygen-containing gas into the chamber via the gas supply means, such that the same gas flow rate is provided at each orifice; and (e) forming a reactively sputtered Co-based alloy magnetic thin film on the at least one surface of the precursor substrate/workpiece, the reactively sputtered thin film having a substantially uniform oxide content.

Yet another aspect of the present invention is magnetic recording media fabricated by the above-described method, e.g., disk-shaped magnetic recording media with a Co-alloy based magnetic recording layer having uniform oxide content over 360° of the disk surface.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, wherein.

DESCRIPTION OF THE INVENTION

The present invention is based upon recognition by the inventors that reactive sputter deposition apparatus may be provided with appropriately designed gas injecting means for readily and reliably forming reactively sputtered thin films having a uniform composition, i.e., content of at least one film component supplied by the reactive gas, over the entire substrate/workpiece surface, e.g., 360° in the case of disk-shaped substrates/workpieces. According to the invention, reactive sputtering apparatus equipped with gas injector means including a gradient orifice array is provided for achieving substantially equal reactive gas injection rates along the length of a gas distribution manifold which is fed with gas from one end. Proper optimization of the orifice size distribution allows the downstream orifices of the manifold to be arbitrarily large, thereby enabling rapid vacuum chamber fill and pump-out essential for short cycle times. Advantageously, the design of the gradient orifice array according to the invention is flexible and admits of a variety of configurations, including linear (i.e., straight), wishbone, and double-ring arrangements. Stated differently, the gradient orifice array, rather than the manifold shape, is the essence of the present invention.

Figure 4A:
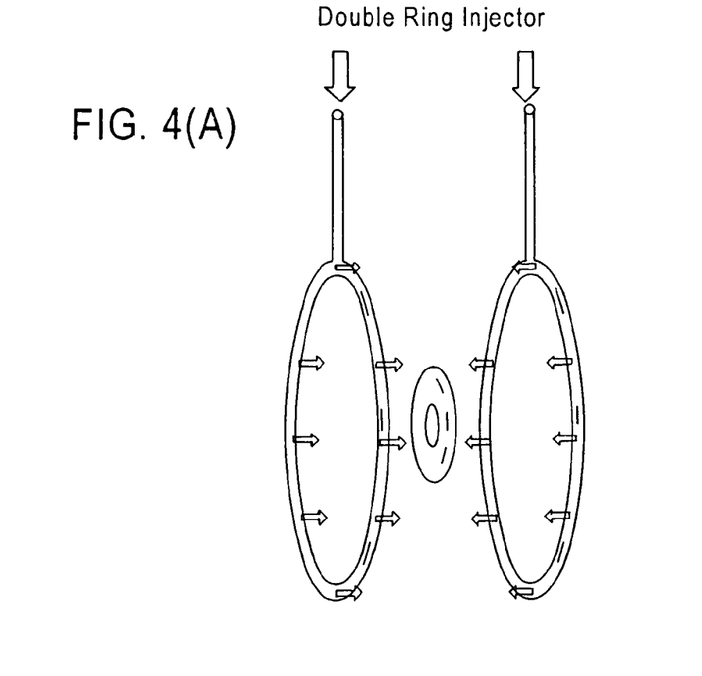
FIG. 4(A) is a simplified, schematic, perspective view of a portion of a reactive sputtering apparatus, such as illustrated in FIG. 1, comprising a pair of ring-shaped gas injectors with a plurality of 0.008" orifices.

The principles of the invention will now be demonstrated by reference to the following examples, wherein the term "wishbone-shaped", as utilized herein, refers to gas injectors (for example, as schematically illustrated in FIG. 1) comprising a linearly elongated, tubular inlet portion having a first, gas inlet end, and a second end, with a pair of arcuately-shaped, tubular gas outlet portions extending from the second end, and comprising a plurality of spaced-apart gas outlet orifices; and the term "ring-shaped", as utilized herein, refers to gas injectors (for example, as schematically illustrated in FIG. 4(A)) comprising a linearly elongated, tubular inlet portion having a first, gas inlet end, and a second end, and a substantially circularly-shaped gas outlet portion extending from the second end, and comprising a plurality of spaced-apart gas outlet orifices.

The first examples illustrate several theoretically derived solutions for gas injector designs intended for providing substantially equal gas flow rates from a number of equally-sized orifices, without regard to cycle time of the sputtering apparatus, which examples are followed by several experimentally verified gradient orifice designs which not only provide substantially equal gas flow rates but also enable short cycle times.

Figure 3A:
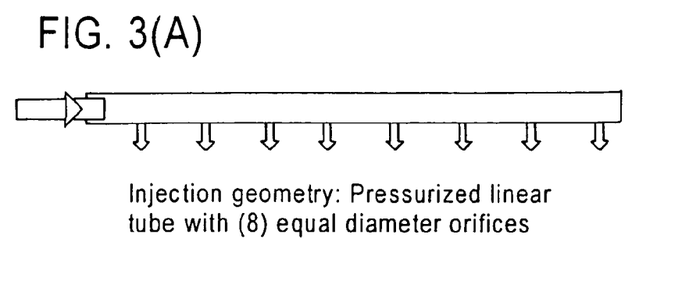
FIG. 3(A) is a simplified, schematic, cross-sectional view of a linearly elongated gas injection tube for use in a reactive sputtering apparatus such as shown in FIG. 1, having a plurality (i.e., 8) of equal-diameter gas orifices.
Figure 3B:
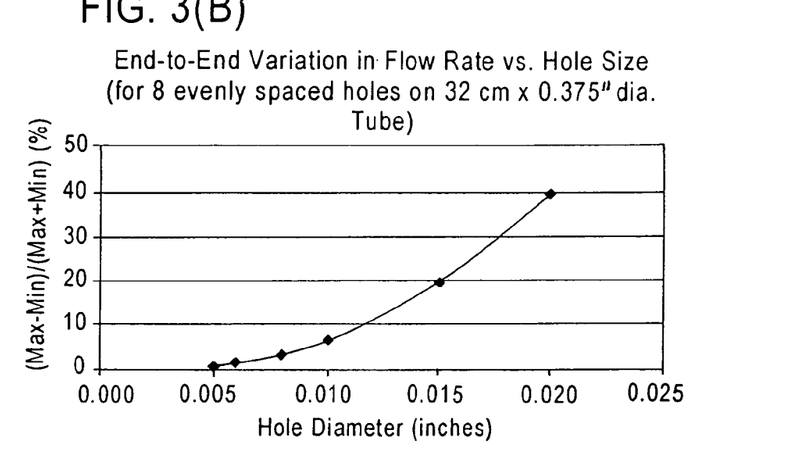
FIG. 3(B) is a graph for illustrating the end-to-end variation in gas flow rate vs. hole size for 8 evenly-spaced holes on a 32 cm×0.375" diameter tube.
Figure 3C:
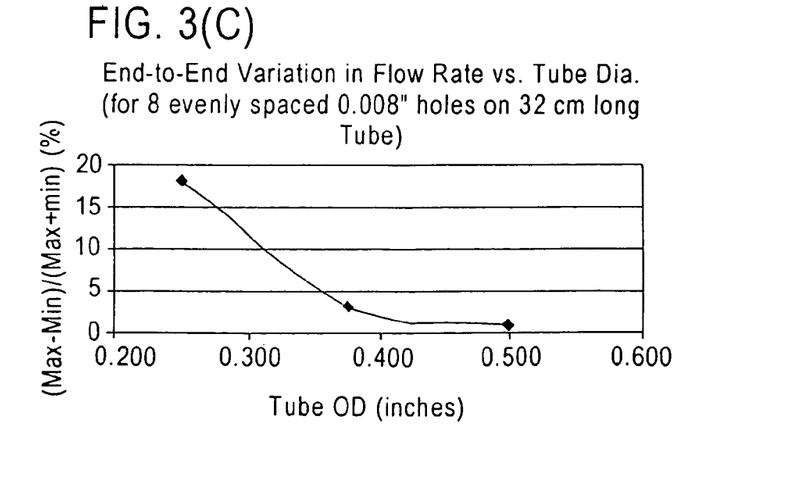
FIG. 3(C) is a graph for illustrating the end-to-end variation in gas flow rate vs. tube diameter for 8 evenly-spaced 0.008" holes on a 32 cm tube.

Referring now to FIGS. 3(A)–3(C), shown therein is the calculated end-to-end variation in flow rate for a uniform array of equal size orifices formed in a tube which is supplied with gas from one end. More specifically, FIG. 3(A) is a simplified, schematic, cross-sectional view of a linearly elongated gas injection tube for use in a reactive sputtering apparatus such as shown in FIG. 1, with a plurality (i.e., 8) of equal-diameter gas orifices; FIG. 3(B) is a graph for illustrating the end-to-end variation in gas flow rate vs. hole size for 8 evenly-spaced holes on a 32 cm×0.375" diameter tube; and FIG. 3(C) is a graph for illustrating the end-to-end variation in gas flow rate vs. tube diameter for 8 evenly-spaced 0.008" holes on a 32 cm tube with 0.049" wall thickness. The orifice conductance is calculated in the molecular flow regime, i.e., where the mean free path of the gas is much larger than the orifice dimensions. Uniform gas injection rates with less than ±5% variation end-to-end, are predicted for an orifice diameter ≦0.008" in a ⅜" diameter tube (see circled points in FIG. 3), but cycle time is a concern due to orifice-limited chamber fill and evacuation rates.

Figure 4B:
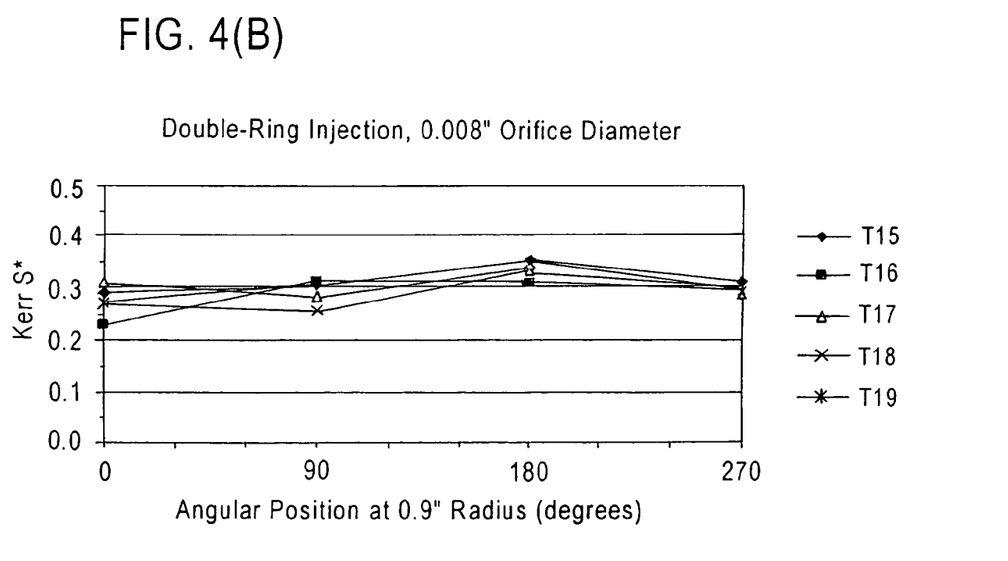
FIG. 4(B) is a graph for illustrating the circumferential variation of S* (in degrees) of the magnetic disk (at a radius of 0.9") shown in FIG. 4(A)
Figure 5A:
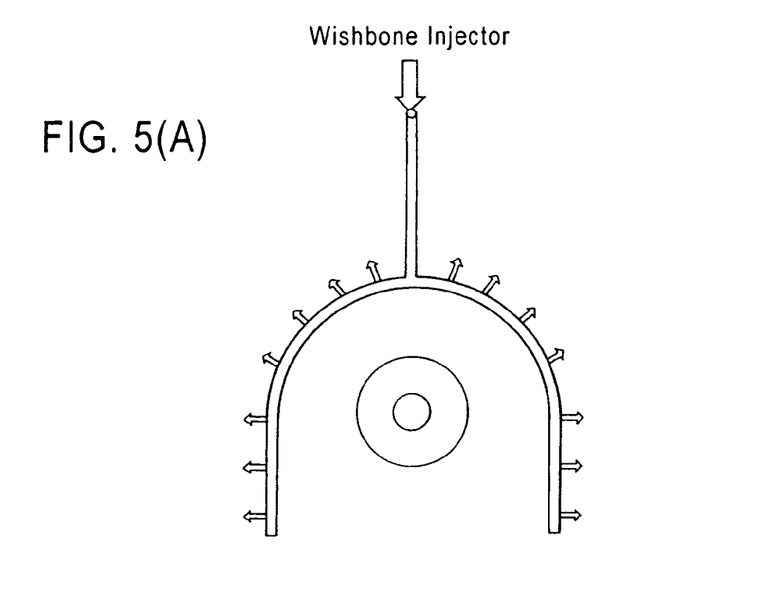
FIG. 5(A) is a simplified, schematic, cross-sectional view of a portion of a reactive sputtering apparatus, such as illustrated in FIG. 1, comprising a wishbone-shaped gas injector with a plurality of 0.008" orifices.
Figure 5B:
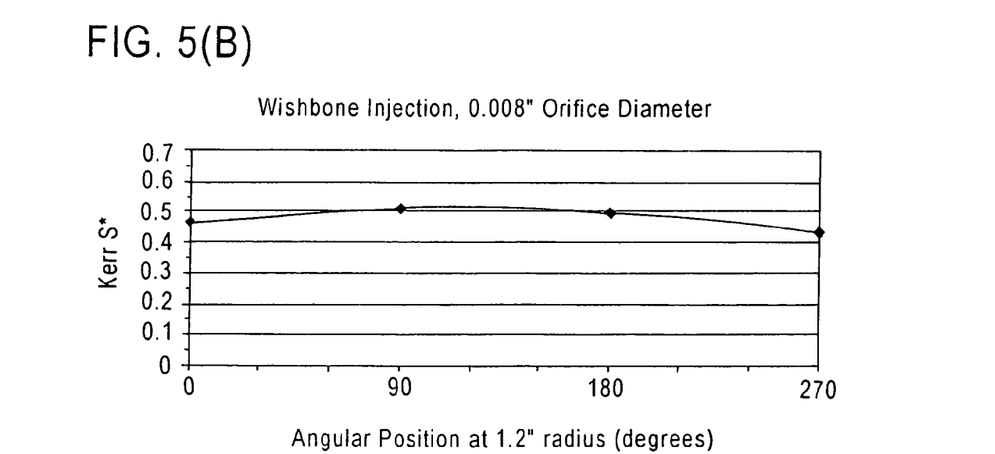
FIG. 5(B) is a graph for illustrating the circumferential variation of S* (in degrees) of the magnetic disk (at a radius of 1.2") shown in FIG. 5(A)

Adverting to FIGS. 4 and 5, FIG. 4(A) shows a simplified, schematic, perspective view of a portion of a reactive sputtering apparatus, such as illustrated in FIG. 1, comprising a pair of ring-shaped gas injectors with a plurality of 0.008" orifices (i.e., 8 evenly spaced orifices); FIG. 4(B) is a graph for illustrating the circumferential variation of S* (in degrees) of the magnetic disk (at a radius of 0.9") shown in FIG. 3(A); FIG. 5(A) shows a simplified, schematic, cross-sectional view of a portion of a reactive sputtering apparatus, such as illustrated in FIG. 1, comprising a wishbone-shaped gas injector with a plurality of 0.008" orifices (i.e., 8 evenly spaced orifices on each arcuate segment); and FIG. 5(B) is a graph for illustrating the circumferential variation of S* (in degrees) of the magnetic disk (at a radius of 1.2") shown in FIG. 5(A).

Sputtering apparatus according to the invention are generally similar to the apparatus schematically illustrated in FIG. 1, and comprise at least one sputtering source (e.g., of conventional type); preferably a pair of mutually facing sputtering sources (e.g., of conventional type) for directing sputtered particle flux towards opposite major surfaces of the disk-shaped substrates (which conventional sputtering sources generally are not shown in the drawing figures for illustrative simplicity). The double-ring injector (see FIG. 4(A)) allows for disk transport using a circular or a vertical (i.e., up-and-down) motion; the wishbone injector (see FIG. 5(A)) is smaller and simpler than the double-ring injector, but allows for vertical disk motion. Gas injection with this wishbone-type injector is outward in order to minimize film deposition in the orifices, and in contrast to the wishbone-style gas injector embodiment shown in FIG. 2(A), each arcuate segment or "leg" extends below the bottom edge of the disk. In this double-ring gas injector embodiment, gas injection is inward, but the orifices are protected (i.e., shielded) from film deposition thereon by appropriate cathode fixturing.

As is evident from the graphs of FIGS. 4(B) and 5(B), significantly improved circumferential uniformity is observed with both gas injector geometries compared to FIG. 2, i.e., the angular variation of S* is within specification. However, the chamber fill and evacuation intervals are excessive, as anticipated. Specifically, for a 9.3 sccm gas flow into the injectors of FIGS. 4(A) and 5(A), about 7 sec. is required to achieve a desired process pressure of 30 mTorr, and about 11 sec. is required to evacuate the process chamber to 1 mTorr after termination of the gas flow.

Additional orifice flow calculations were performed in order to provide an orifice arrangement which provides uniform gas injection and increased gas conductance from the orifices for faster system response (i.e., chamber fill and evacuation). It was determined that uniform gas injection can be achieved for certain designs utilizing orifice gradients wherein the orifice size (e.g., diameter) increases with distance from the gas supply (i.e., inlet to the gas injector).

Figure 6A:
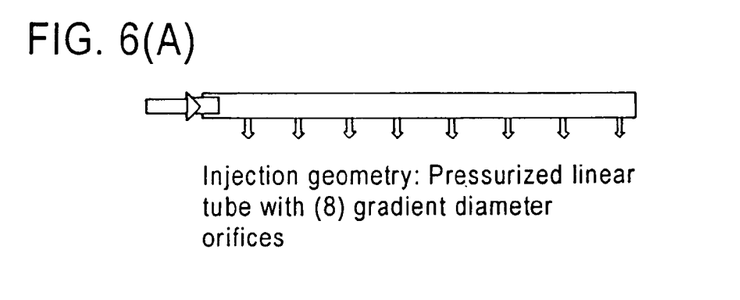
FIG. 6(A) is a simplified, schematic, cross-sectional view of a linearly elongated gas injection tube (⅜" O.D., 0.049" wall thickness) according to an embodiment of the invention, for use in a reactive sputtering apparatus such as illustrated in FIG. 1, and having a plurality (i.e., 8) of equally-spaced, circularly-shaped, gas orifices with gradient diameters increasing with distance from the inlet end.
Figure 6B:
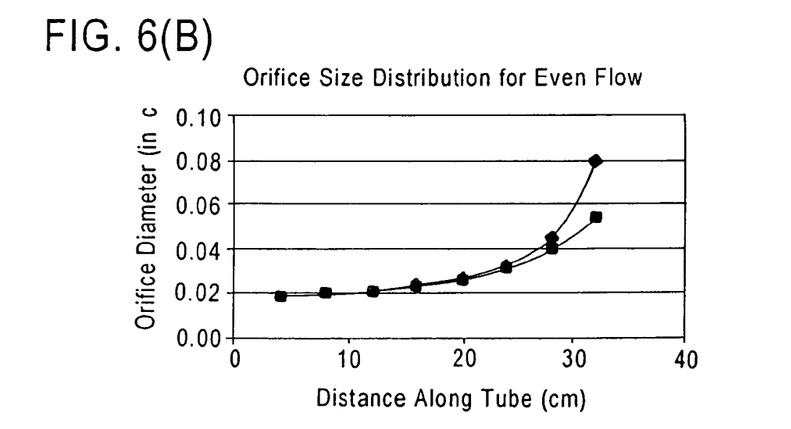
FIG. 6(B) is a graph for illustrating the variation of orifice diameter of the linear gas injector tube of FIG. 6(A) for substantially equal gas flow therefrom, as a function of distance of the orifice from the inlet end, for 2 different orifice size distributions.
Figure 6C:
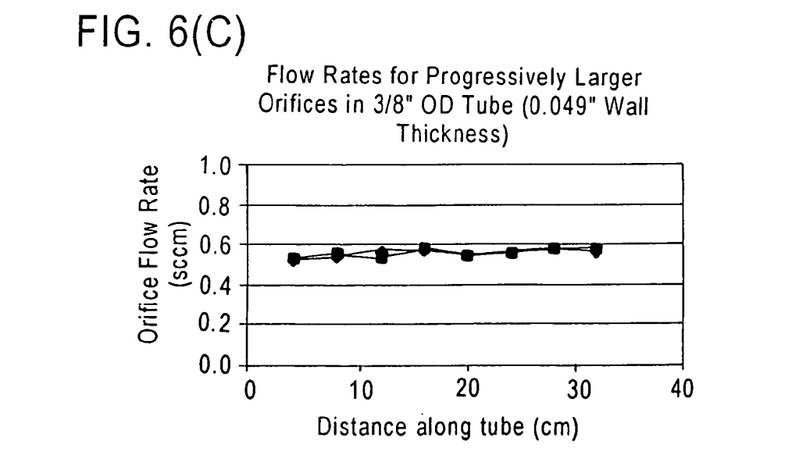
FIG. 6(C) is a graph for illustrating the variation of the flow rate from each of the orifices of the linear gas injector tube of FIG. 6(A) having the orifice gradients of FIG. 6(B), as a function of distances of the orifices from the inlet end.

FIG. 6(A) is a simplified, schematic, cross-sectional view of a linearly elongated gas injection tube (⅜" O.D., 0.049" wall thickness) according to an embodiment of the invention, for use in a reactive sputtering apparatus such as illustrated in FIG. 1, and having a plurality (i.e., 8) of equally-spaced, circularly-shaped, gas orifices with gradient diameters increasing with distance from the inlet end; FIG. 6(B) is a graph for illustrating the variation of orifice diameter of the linear gas injector tube of FIG. 6(A) for substantially equal gas flow therefrom, as a function of distance of the orifice from the inlet end, for two different orifice size distributions; and FIG. 6(C) is a graph for illustrating the variation of the flow rate from each of the orifices of the linear gas injector tube of FIG. 6(A) having the orifice gradients of FIG. 6(B), as a function of distances of the orifices from the inlet end. Each of the two different orifice size distributions of FIG. 6(B) is seen to provide substantially the same gas flow from each orifice.

Figure 7A:
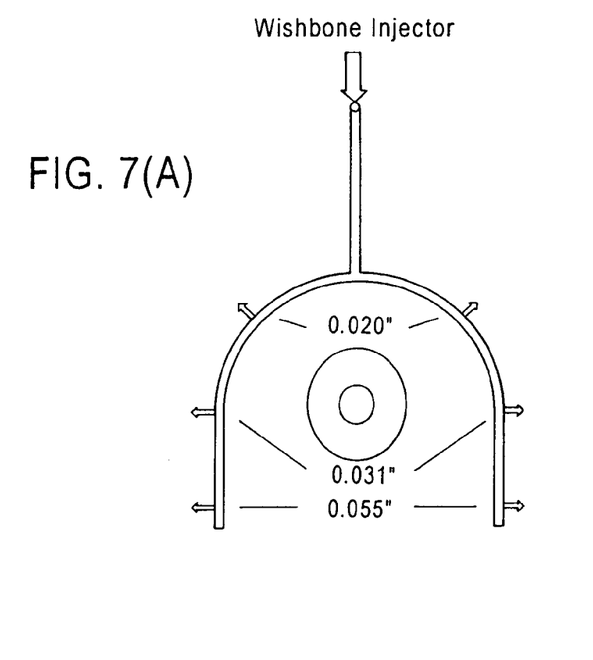
FIG. 7(A) is a simplified, schematic, cross-sectional view of an embodiment of a wishbone-type gas injector according to the invention, for use in a reactive sputtering apparatus such as illustrated in FIG. 1, wherein each arcuate segment or leg includes three (3) equally-spaced, circularly-shaped, gas orifices with gradient diameters increasing with distance from the inlet end (0.020", 0.031", and 0.055')
Figure 7B:
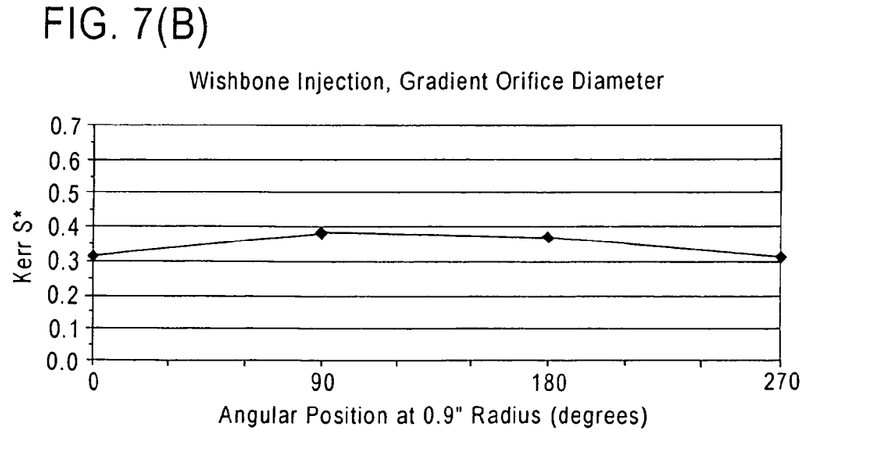
FIG. 7(B) is a graph for illustrating the circumferential variation of S* of a magnetic disk (in degrees) at a radius of 0.9".

The model predictions for gradient orifice gas injectors on circumferential magnetic film uniformity were experimentally evaluated by means of a wishbone injector. FIG. 7(A) is a simplified, schematic, cross-sectional view of an embodiment of a wishbone-type gas injector according to an embodiment of the invention, wherein each arcuate segment or leg includes three (3) equally-spaced, circularly-shaped, gas orifices with gradient diameters increasing with distance from the inlet end (0.020", 0.031", and 0.055'); and FIG. 7(B) is a graph for illustrating the circumferential variation of S* of a magnetic disk (in degrees) at a radius of 0.9". As demonstrated in FIG. 7(B), circumferential uniformity of S* is good, well within specification. Chamber fill and evacuation intervals are greatly reduced, i.e., to about 3 sec. each, significantly better than the uniform size orifice design of FIG. 5.

Referring again to the model predictions of FIG. 6, it is apparent that the gas flow rate from each orifice is substantially equal for the two illustrated orifice size distributions. In fact, it is found that for the ultimate (i.e., most distal) orifice diameter of 0.055" (or greater), the diameter of that orifice has little or no effect on steady state flow rates through any of the orifices. The results indicate that the size (e.g., diameter) of the ultimate orifice may be as large as the tube diameter for even faster system response time, without sacrifice of uniform gas injection.

According to another advantageous feature of the present invention affording ease of injector fabrication and flexibility of injector design, the orifices themselves were formed in screws which are readily installed in and/or removed from openings formed in the injector tubing.

The non-intuitive, i.e., non-obviousness nature of the present invention cannot be over-emphasized, in that it is considered important that the faulty underlying principle of the wishbone-style gas injector of FIG. 2 be considered. Specifically, this injector was provided with equally-sized orifices for ease of fabrication, and the orifice diameter was chosen such that the total cross-sectional area of the orifice openings, i.e., 0.025 in$^2$, is comparable to the cross-sectional area of the injector tube, i.e., 0.023 in$^2$. This intuitive design has been adopted by numerous routineers in the art of gas distribution systems for reactive sputtering. While this design principle is valid for pressurized liquid flow delivery systems, e.g., lawn sprinklers, bathroom shower heads, and high pressure gas manifolds (see, e.g., U.S. Pat. No. 5,667,650), this design is not useful for low pressure, molecular flow delivery systems as addressed by this invention. The predictions of the models utilized for FIGS. 3 and 6 indicate that, for a wishbone-type injector such as illustrated in FIG.

2, with 0.040" diameter orifices, nearly all of the injected gas enters the vacuum chamber through the first one or two orifices of each arcuate segment or leg, consistent with the observation of higher oxide content at the disk top center (the 90° position).

In gas injectors with equally-sized orifices operating in the molecular flow regime, the total area of the orifice openings must be considerably less than the manifold area for uniform injection. For example, for the circled point of FIG. 3(C), the ratio (in %) of the total orifice area ($4.02 \times 10^{-4}$ in$^2$) to the tube area ($6.03 \times 10^{-2}$ in$^2$) is only 0.7%, which result is surprising to routineers in the art of reactive sputtering. Moreover, the inventors have demonstrated that in the molecular flow regime, gradient orifice distributions exist which provide uniform gas injection while allowing use of open-ended manifolds providing significantly reduced response times. The latter result is surprising, given the modest length-to-diameter aspect ratio of the manifold tubes considered.

The present invention thus provides a number of advantages over conventional apparatus and methodology for reactive sputtering, including improved compositional uniformity over 360° of a substrate surface, e.g., a magnetic disk substrate, and substantially improved process cycling times, e.g., decreased chamber fill and evacuation intervals. Further, utilization of the inventive apparatus and methodology as part of conventional manufacturing apparatus for hard disk recording media can be readily implemented, in view of the full compatibility of the invention with all other aspects of automated media manufacture. Finally, the inventive apparatus and methodology are broadly applicable to reactive sputtering processing utilized for the manufacture of a variety of different products, e.g., coated architectural glass and multi-layer optical coatings.

In the previous description, numerous specific details are set forth, such as specific materials, structures, processes, etc., in order to provide a better understanding of the present invention. However, the present invention can be practiced without resorting to the details specifically set forth. In other instances, well-known processing materials and techniques have not been described in detail, in order not to unnecessarily obscure the present invention.

Only the preferred embodiments of the present invention and but a few examples of its versatility are shown and described in the present invention. It is to be understood that the present invention is capable of use in various other embodiments and is susceptible of changes and/or modifications within the scope of the inventive concept as expressed herein.

What is claimed is:

1. A sputter deposition apparatus, comprising:
   (a) a chamber defining an interior space adapted to be maintained at a reduced pressure;
   (b) at least one sputtering source in said chamber;
   (c) mounting means for positioning a substrate/workpiece in said chamber for receipt of a sputtered particle flux from said at least one sputtering source; and
   (d) at least one gas supply means for injecting a gas into said chamber, said at least one gas supply means extending into said chamber and comprising a plurality of differently-sized outlet orifices adapted for providing substantially the same flow rate of gas from each orifice, wherein
   said gas supply means comprises an inlet portion and an outlet portion including said plurality of differently-sized outlet orifices, the size of said outlet orifices progressively increasing with distance from said inlet portion, and
   said gas supply means is wishbone-shaped and comprises a linearly elongated, tubular inlet portion having first and second ends, a pair of arcuately shaped, tubular outlet portions extending from said second end, the size of said outlet orifices of each of said arcuate outlet portions progressively increasing with distance from said second end of said inlet portion.

2. The apparatus as in claim 1, wherein:
   said at least one sputtering source comprises a pair of mutually facing sputtering sources, and said mounting means is adapted for positioning a substrate/workpiece having a pair of oppositely facing surfaces within a central space defined by said pair of outlet portions of said wishbone-shaped gas supply means.

3. The apparatus as in claim 2, wherein:
   said plurality of outlet orifices of each of said pair of outlet portions face away from said central space.

4. The apparatus as in claim 1, wherein: each of said plurality of outlet orifices is circularly-shaped.

5. The apparatus of claim 1, wherein each outlet comprises a plug with a central opening extending therethrough defining the diameter of the orifice.

6. A sputter deposition apparatus comprising:
   (a) a chamber defining an interior space adapted to be maintained at a reduced pressure;
   (b) at least one sputtering source in said chamber;
   (c) mounting means for positioning a substrate/workpiece in said chamber for receipt of a sputtered particle flux from said at least one sputtering source; and
   (d) at least one gas supply means for injecting a gas into said chamber, said at least one gas supply means extending into said chamber and comprising a plurality of differently-sized outlet orifices adapted for providing substantially the same flow rate of gas from each orifice, wherein
   said gas supply means comprises an inlet portion and an outlet portion including said plurality of differently-sized outlet orifices, the size of said outlet orifices progressively increasing with distance from said inlet portion, and
   said gas supply means is ring-shaped and comprises a linearly elongated, tubular inlet portion having first and second ends, and a substantially circularly-shaped outlet portion extending from said second end, the size of said plurality of outlet orifices of said outlet portion progressively increasing with distance from said second end of said inlet portion.

7. The apparatus as in claim 6, wherein:
   said at least one sputtering source comprises a pair of mutually facing sputtering sources;
   said apparatus comprises a parallel spaced-apart pair of said ring-shaped gas supply means; and
   said mounting means is adapted for positioning a substrate/workpiece having a pair of oppositely facing surfaces, and is located within a central space located between said circularly-shaped outlet portions of said pair of ring-shaped gas supply means.

8. The apparatus as in claim 7, wherein:
   said outlet orifices of each of said pair of circularly-shaped outlet portions face inwardly toward said central space.

9. The apparatus according to claim 7, wherein:
   said outlet orifices of each of said pair of circularly-shaped outlet portions face said substrate/workpiece.

10. A method of forming a thin film on a substrate/workpiece by sputtering, comprising steps of:
- (a) providing an apparatus comprising a vacuum chamber including at least one sputtering source and a gas supply means for injecting a gas containing at least one reactive component into said chamber, said gas supply means comprising a plurality of differently-sized outlet orifices adapted for providing substantially the same flow rate of gas from each orifice;
- (b) providing said apparatus with a substrate/workpiece having at least one surface for formation of a thin film thereon;
- (c) generating a sputtered particle flux from said at least one sputtering source;
- (d) injecting said gas containing said at least one reactive component into said chamber via said gas supply means, such that substantially the same gas flow rate is provided at each orifice; and
- (e) forming a reactively sputtered thin film on said at least one surface of said substrate/workpiece, said reactively sputtered thin film having a substantially uniform content of said at least one reactive component, wherein:
- step (a) comprises providing an apparatus wherein said gas supply means comprises an inlet portion and an outlet portion including said plurality of differently-sized outlet orifices, the size of said outlet orifices progressively increasing with distance from said inlet portion, and
- said gas supply means is wishbone-shaped and comprises a linearly elongated, tubular inlet portion having first and second ends, a pair of arcuately shaped, tubular outlet portions extending from said second end, the size of said outlet orifices of each of said arcuate outlet portions progressively increasing with distance from said second end of said inlet portion.

11. The method according to claim 10, wherein:
step (a) comprises providing an apparatus including a pair of mutually facing sputtering sources;
step (b) comprises positioning a substrate/workpiece having a pair of surfaces within a central space in said chamber defined by said pair of outlet portions of said wishbone-shaped gas supply means, each surface of said substrate/workpiece facing a respective one of said pair of sputtering sources; and
step (c) comprises generating a sputtered particle flux from each of said pair of sputtering sources.

12. The method according to claim 10, wherein:
step (a) comprises providing an apparatus including at least one Co-based magnetic alloy;
step (b) comprises providing said apparatus with a precursor substrate/workpiece for a magnetic recording medium;
step (d) comprises injecting an oxygen-containing gas into said chamber; and
step (e) comprises forming a Co-based alloy magnetic recording layer with oxide-separated magnetic grains.

13. A method of forming a thin film on a substrate/workpiece by sputtering, comprising steps of:
- (a) providing an apparatus comprising a vacuum chamber including at least one sputtering source and a gas supply means for injecting a gas containing at least one reactive component into said chamber, said gas supply means comprising a plurality of differently-sized outlet orifices adapted for providing substantially the same flow rate of gas from each orifice;
- (b) providing said apparatus with a substrate/workpiece having at least one surface for formation of a thin film thereon;
- (c) generating a sputtered particle flux from said at least one sputtering source;
- (d) injecting said gas containing said at least one reactive component into said chamber via said gas supply means, such that substantially the same gas flow rate is provided at each orifice; and
- (e) forming a reactively sputtered thin film on said at least one surface of said substrate/workpiece, said reactively sputtered thin film having a substantially uniform content of said at least one reactive component, wherein:
- step (a) comprises providing an apparatus wherein said gas supply means comprises an inlet portion and an outlet portion including said plurality of differently-sized outlet orifices, the size of said outlet orifices progressively increasing with distance from said inlet portion, and
- said gas supply means is ring-shaped and comprises a linearly elongated, tubular inlet portion having first and second ends, and a substantially circularly-shaped outlet portion extending from said second end, the size of said outlet orifices of said outlet portion progressively increasing with distance from said second end of said inlet portion.

14. The method according to claim 13, wherein:
step (a) comprises providing an apparatus including a pair of mutually facing sputtering sources;
step (b) comprises positioning a substrate/workpiece having a pair of surfaces within a central space in said chamber defined by a parallel spaced-apart pair of said ring-shaped gas supply means, each surface of said substrate/workpiece facing a respective one of said pair of sputtering sources; and
step (c) comprises generating a sputtered particle flux from each of said pair of sputtering sources.

15. The method according to claim 14, wherein:
said plurality of outlet orifices face said substrate/workpiece.

* * * * *